(12) United States Patent
Moriya et al.

(10) Patent No.: US 6,961,357 B2
(45) Date of Patent: Nov. 1, 2005

(54) SEMICONDUCTOR LASER MODULE (75) Inventors: Hiroshi Moriya, Chiyoda-machi (JP);
Kisho Ashida, Chiyoda-machi (JP);
Yoshiaki Niwa, Yokohama (JP)

(73) Assignee: OpNext Japan, Inc., Yokohama (JP)

( * ) Notice: Subject to any disclaimer, the term of this patent is extended or adjusted under 35 U.S.C. 154(b) by 11 days.

(21) Appl. No.: 10/632,331

(22) Filed: Jul. 31, 2003

(65) Prior Publication Data
US 2004/0233951 A1 Nov. 25, 2004

(30) Foreign Application Priority Data
May 20, 2003 (JP) .............. 2003-141617

(51) Int. Cl.[7] .............. H01S 3/04; H01S 5/00
(52) U.S. Cl. .............. 372/34; 372/36; 372/43
(58) Field of Search .............. 372/43, 34–36, 372/45; 257/467; 385/88

(56) References Cited

U.S. PATENT DOCUMENTS

| | | | |
|---|---|---|---|
| 6,802,655 B2 * | 10/2004 | Yokoyama et al. | ........... 385/88 |
| 6,810,049 B2 * | 10/2004 | Wakisaka et al. | .............. 372/36 |
| 2002/0121671 A1 * | 9/2002 | Wakisaka et al. | ........... 257/467 |
| 2003/0053502 A1 * | 3/2003 | Wakisaka et al. | .............. 372/45 |
| 2003/0151059 A1 * | 8/2003 | Wakisaka et al. | .............. 257/99 |

FOREIGN PATENT DOCUMENTS

| | | |
|---|---|---|
| JP | A-5-299699 | 11/1993 |
| JP | A-2001-168445 | 6/2001 |

* cited by examiner

*Primary Examiner*—Don Wong
*Assistant Examiner*—Hung Tran Vy
(74) *Attorney, Agent, or Firm*—Townsend and Townsend and Crew LLP

(57) ABSTRACT

In a semiconductor laser module, in order to sufficiently reduce the thermal stress arising in a due to the bonding of elements when they are packaged and to improve the yield of production, the semiconductor laser module is provided with a semiconductor laser element, a submount bonded to the semiconductor laser element with a solder layer in-between and thereby mounted with it, and a base mounted with this submount with another solder layer in-between. Herein, $T/W \geq 0.15$ holds, where W is the width of the submount in the direction orthogonal to the optical axis of the semiconductor laser element and T is the thickness of the submount.

1 Claim, 8 Drawing Sheets

SEMICONDUCTOR LASER MODULE

BACKGROUND OF THE INVENTION

1. Field of the Invention

The present invention relates to a semiconductor laser module, and more particularly to a semiconductor laser module having a suitable structure for reducing thermal stress arising from bonding of elements at the time of packaging.

2. Description of the Related Art

In recent years, semiconductor laser elements for mounting on a semiconductor laser module for use in optical communication have come to require higher output and greater accuracy in wavelength. There is a further need to prevent deterioration in element performance in terms of the occurrence of kinks and an increase in current threshold and thereby to improve the production yield. To meet these requirements, it is necessary to reduce thermal stress that occurs when a semiconductor laser element is soldered onto a submount and the base.

In view of this need, there is known a configuration, as described in JP-A-5-299699, in which a submount using a base metal of aluminum nitride (AlN), whose linear expansion coefficient is close to that of the semiconductor laser element, is used over a base of a ferrous material, and the thickness of the submount is properly set to reduce stress.

Also known is a configuration, as described in JP-A-2001-168445, which is designed to reduce stress by properly setting the combined thickness of the semiconductor laser chip and the submount and the width of the semiconductor laser chip when the chip and the submount are to be mounted on a base of a ferrous material (or a copper-based material).

However, the present inventors made research work focusing on the thickness of the submount taken up in JP-A-5-299699 and on the combined thickness of the semiconductor laser chip and the submount taken up in JP-A-2001-168445, and found that stress cannot always be sufficiently reduced merely by adjusting the thickness of the submount. If the stress reduction is insufficient, such defects as current threshold fluctuations or kinks will arise, resulting in a problem of a yield drop in the manufacture of semiconductor laser modules.

BRIEF SUMMARY OF THE INVENTION

An object of the present invention is to provide a semiconductor laser module permitting a sufficient reduction of the aforementioned stress and an improvement of the production yield.

In order to achieve the object mentioned above, according to a first aspect of the invention, there is provided a semiconductor laser module having a semiconductor laser element, a submount bonded to this semiconductor laser element with a solder layer in-between and thereby mounted with it, and a base mounted with this submount with another solder layer in-between, wherein $T/W \geq 0.15$ holds, where W is the width of the submount in the direction orthogonal to the optical axis of the semiconductor laser element and T is the thickness of the submount.

This configuration makes possible a sufficient reduction of the stress and an improvement of the production yield.

In the foregoing configuration according to the first aspect of the invention, preferably the main constituent material of the semiconductor laser element is to be indium-phosphorus, the member constituting the submount, aluminum nitride, and the main constituent material of the base, copper-tungsten.

In order to achieve the object mentioned above, according to a second aspect of the invention, there is provided a semiconductor laser module having a semiconductor laser element, a submount bonded to this semiconductor laser element with a solder layer in-between and thereby mounted with it, and a base mounted with this submount with another solder layer in-between, wherein the submount consists of a laminated structure of at least two members, a first member and a second member constituting the submount are bonded together by a solder layer A, the semiconductor laser element is bonded onto the top face of the submount by a solder layer B, the base is bonded onto the bottom face of the submount by a solder layer C, and the relationship among the melting points of the solder layers A, B and C is $\alpha A > \alpha B > \alpha C$ where $\alpha A$, $\alpha B$ and $\alpha C$ are the respective melting points of the three solder layers.

This configuration makes possible a sufficient reduction of the stress and an improvement of the production yield.

In the foregoing configuration according to the second aspect of the invention, preferably the main constituent material of the semiconductor laser element is to be indium-phosphorus, the main constituent material of the base, copper-tungsten, of the two members constituting the submount having a laminated structure, the first member positioned towards the semiconductor laser element is to be made of aluminum nitride, and the second member positioned towards the base, of copper-tungsten.

Further, in the above configuration according to the second aspect of the invention, preferably the main constituent material of the solder layer A is to be gold-germanium, that of the solder layer B, gold-tin, and that of the solder layer C, tin-lead.

In order to achieve the object mentioned above, according to a third aspect of the invention, there is provided a semiconductor laser module having a semiconductor laser element, a submount bonded to this semiconductor laser element with a solder layer in-between and thereby mounted with it, and a base mounted with this submount with another solder layer in-between, wherein the stress working in the semiconductor laser element is kept within a range of $\pm 20$ MPa.

This configuration makes possible a sufficient reduction of the stress and an improvement of the production yield.

Other objects, features and advantages of the invention will become apparent from the following description of the embodiments of the invention taken in conjunction with the accompanying drawings.

DETAILED DESCRIPTION OF THE INVENTION

The structure of a semiconductor laser module according to a first preferred embodiment of the present invention, will be described below with reference to FIG. 1 through FIG. 8.

First will be described the structure of the semiconductor laser module embodying the invention in this mode with reference to FIG. 1.

Figure 1:
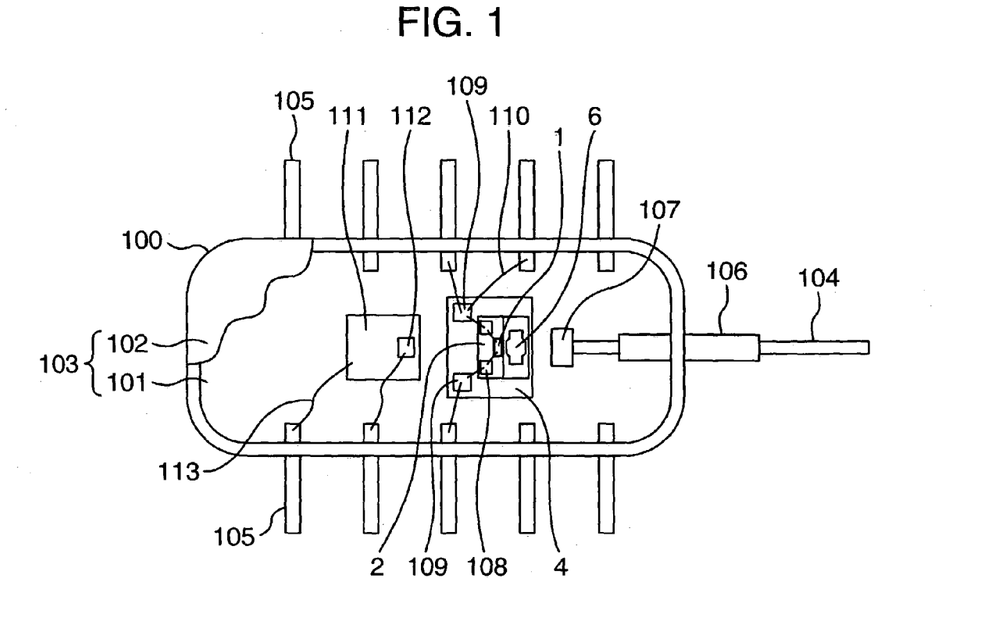
FIG. 1 shows a top view of essential parts of the structure of a semiconductor laser module according to a first preferred embodiment of the present invention.

FIG. 1 shows a top view of essential parts of the structure of the semiconductor laser module according to the first preferred embodiment of the invention.

A semiconductor laser module 100 has a package 103 consisting, for instance, of a box-shaped package body 101 and a lid 102. The semiconductor laser module 100 further has an optical cable (optical fiber) 104 extending in and out of the package 103. The optical cable 104 is inserted into a guide pipe 106 penetrating the package body 101 and fixed with a bonding agent (not shown).

On the top face of the bottom of the package body 101 at the center is mounted a semiconductor laser element 1 with a submount 2 and a base 4 in-between. Details of the mounted state of the semiconductor laser element 1 will be described in detail afterwards with reference to FIG. 2. The tip of the optical cable 104 is optically connected to an isolator 107. A lens 6 is arranged between this isolator 107 and the light emitting face of the semiconductor laser element 1.

On both flanks of the package body 101 are arrayed a plurality of electrode terminals 105 to constitute an electrode terminal-equipped package. These electrode terminals 105 extend in and out of the package body 101.

The semiconductor laser element 1 is electrically connected to the electrode terminals 105 by wires 110 by way of electrode pads 108 and 109.

To the top face of the bottom of the package body 101 is fixed a light receiving element 112 with a submount 111 in-between. The electrodes of the light receiving element 112 and the submount 111 are electrically connected to the electrode terminals 105 by wires 113.

Next will be described, with reference to FIG. 2, the mounted state of the semiconductor laser element 1 on the submount 2 and the base 4 in the semiconductor laser module embodying the invention in this mode.

Figure 2:
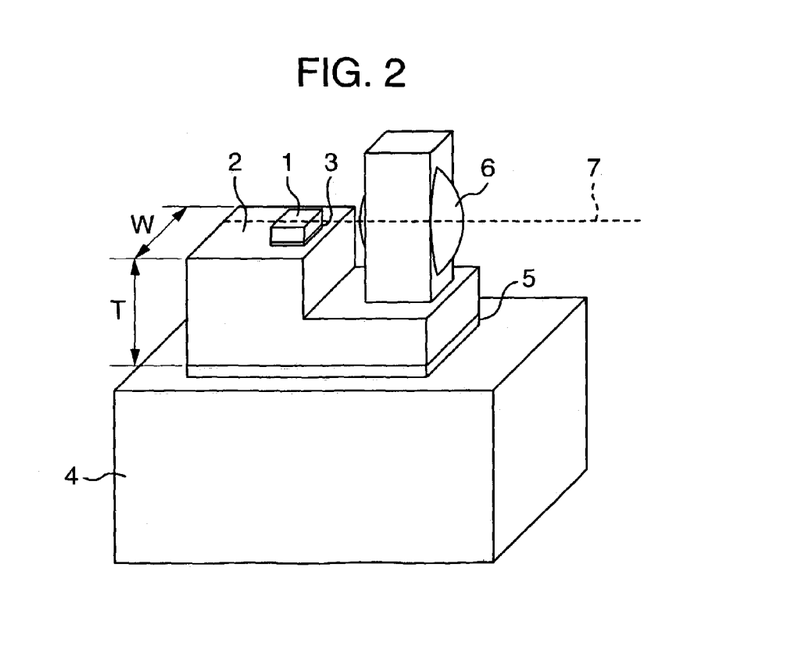
FIG. 2 shows a perspective view of the state of mounting of a semiconductor laser element 1 on a submount 2 and a base 4 in the semiconductor laser module according to the first preferred embodiment of the invention.

FIG. 2 shows a perspective view of the state of mounting of the semiconductor laser element 1 on the submount 2 and the base 4 in the semiconductor laser module according to the first preferred embodiment of the invention.

The semiconductor laser element 1 is bonded to the submount 2 with a solder layer 3 in-between. The submount 2 is bonded to the base 4 with a solder layer 5 in-between. In the direction of the optical axis 7 of the semiconductor laser element 1, the lens 6 is bonded to the submount 2 with another solder layer (not shown) in-between. Incidentally, the element to which the lens 6 is to be bonded is not necessarily limited to the submount 2, but may be some other element, such as the base.

The thickness T of the submount 2 here refers to the thickness of the submount 2 in the position where the laser element 1 is mounted. The width W of the submount 2 refers to the width of the submount 2 in the direction orthogonal to the optical axis 7 in the position where the laser element 1 is mounted.

In the manufacture of a semiconductor laser module, characteristics (current threshold, differential efficiency, presence or absence of kinks, and so forth) of the laser element are checked after the laser element assembling step and after the module assembling step. The laser element assembling step is a step at which the semiconductor laser element is mounted on the submount and the base for testing use. The module assembling step is a step at which the submount mounted with the semiconductor laser element is removed from the base for testing use, and is mounted on the package body having a base for production use and optical components including an optical cable, an isolator and a lens.

The material employed for the base for testing use is, for instance, copper (Cu) which is highly thermally conductive and inexpensive, and that for the base for production use is typically copper-tungsten (CuW) which is less thermally conductive but smaller in the coefficient of linear expansion than copper. For the purpose of ensuring the accuracy of testing the characteristics of the laser element, it is more preferable to employ a base for testing use and a base for production use of the same material. However, since the base for testing use has to be discarded after it is employed a few times, expensive copper-tungsten cannot be employed. For this economic reason, copper is chosen for the base for testing use, and copper-tungsten, which is less thermally conductive but smaller than copper and closer to the submount and the laser element in the coefficient of linear expansion, for the base for production use. On account of this difference in material between the base for testing use and the base for production use, even if a product mounted on a base for testing use is found acceptable in the test after the laser element assembling step, the same product mounted on a base for production use may be rejected in the later test after the module assembling step.

Next will be explained how stress works on the optically active layer of the semiconductor laser element 1 in the semiconductor laser module embodying the invention in this mode with reference to FIG. 3 and FIG. 4.

Figure 3:
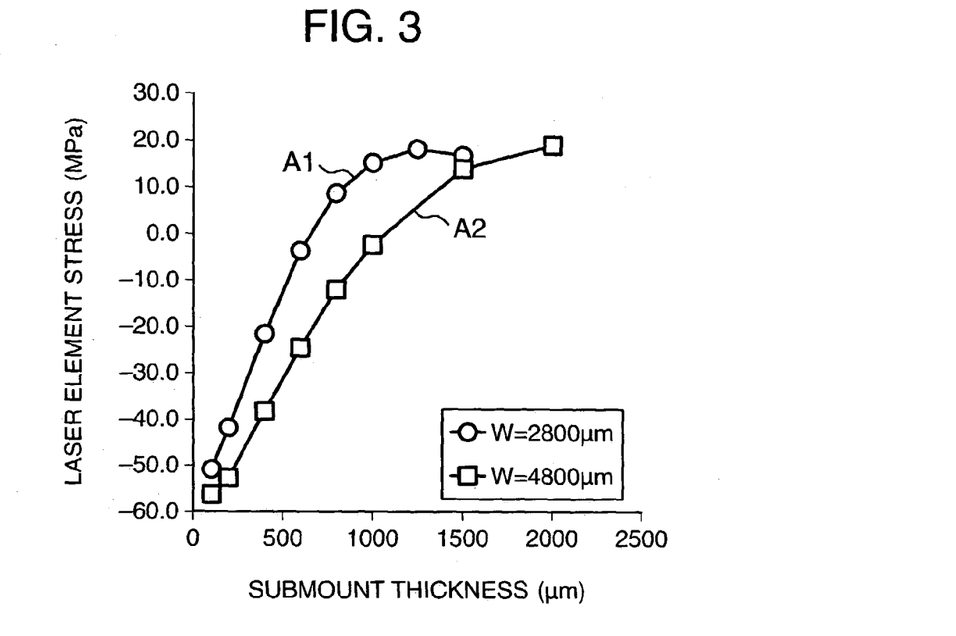
FIG. 3 illustrates how stress works on an optically active layer of the semiconductor laser element 1 in the semiconductor laser module according to the first preferred embodiment of the invention.
Figure 4:
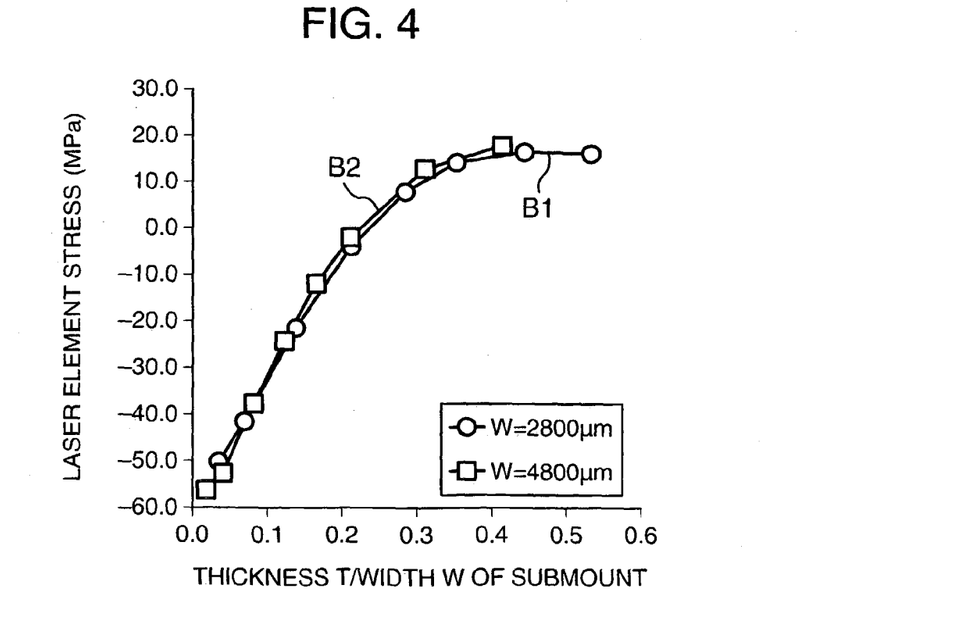
FIG. 4 illustrates in another way how stress works on the optically active layer of the semiconductor laser element 1 in the semiconductor laser module according to the first preferred embodiment of the invention.

FIG. 3 and FIG. 4 illustrate how stress works on the optically active layer of the semiconductor laser element 1 in the semiconductor laser module according to the first preferred embodiment of the invention.

FIG. 3 illustrates a relationship between the stress working in the optically active layer (not shown) of the semiconductor laser element 1 and the submount thickness T. The axis of ordinate in FIG. 3 represents the laser element stress (in MPa) working in the optically active layer of the semiconductor laser element 1. The negative stress level here means a compressive stress, and the positive stress level, a tensile stress. The axis of abscissa in FIG. 3 represents the thickness T ($\mu$m) of the submount 2. That is, FIG. 3 shows the dependence of the laser element stress on the submount thickness T.

In FIG. 3, the laser element stress is the thermal stress that arises when the laser element 1, the submount 2 and the base 4 are bonded with the solder layers 3 and 5 as shown in FIG. 2, and its level is determined at room temperature. The stress levels shown in FIG. 3 are calculated results analytically obtained by the finite element method (FEM). The semiconductor laser element 1 here is made of indium-phosphorus (InP). In this instance, the length of the semiconductor laser element 1 in the direction of the optical axis 7 is 200 $\mu$m, its width in the direction orthogonal to the optical axis 7, 400 $\mu$m, and its thickness, 100 $\mu$m. The material of the base 4 is copper (Cu) to be employed for the base for testing use, and that of the submount 2, aluminum nitride (AlN). Gold-tin (AuSn) is used for the solder layer 3, and tin-lead (PbSn), for the solder layer 5.

These being the underlying conditions, FIG. 3 shows how the laser element stress varies with the submount thickness T. In this example, the variations of the laser element stress with the submount thickness T are shown at two different submount widths W, 2800 $\mu$m (represented by solid line A1) and 4800 $\mu$m (solid line A2).

As shown in FIG. 3, the stress working in the semiconductor laser element 1 varies dependent on the thickness T of the submount 2. Especially, it is seen that compressive stress works on the semiconductor laser element 1 when the submount thickness T is small and that tensile stress works when the thickness is great. It is also seen that the stress working in the semiconductor laser element 1 is also dependent on the width W of the submount 2. Therefore, sometimes the stress cannot be sufficiently reduced by determining only the thickness T of the submount 2.

In order to prevent defects in the element, such as kinks, it is necessary to reduce the stress working in the laser element. FIG. 3 reveals that the stress can be reduced substantially to zero by setting the thickness T to about 700 $\mu$m when the submount width W is 2800 $\mu$m, or by setting the former to 1000 $\mu$m when the latter is 4800 $\mu$m.

FIG. 4 illustrates the relationship between the stress working in the optically active layer of the semiconductor laser element 1 and the submount thickness T/width W ratio. The abscissa axis in FIG. 4 represents the submount thickness T/width W ratio.

FIG. 4 shows the result of rearrangement of the stress levels shown in FIG. 3 into their relationship to the submount thickness T/width W ratio. Solid line B1 shows a case in which T is 2800 $\mu$m and solid line B2, when it is 4800 $\mu$m. These lines reveal that the relationship between the element stress and T/W is not dependent on the submount width W. Thus it is seen from FIG. 4 that by setting the submount thickness T/submount width W ratio to 0.22, the element stress can be reduced substantially to zero independent of the submount width.

Now will be explained the relationship between the stress in the semiconductor laser module and the proportion defective in a semiconductor laser module according to this embodiment of the invention with reference to FIG. 5.

Figure 5:
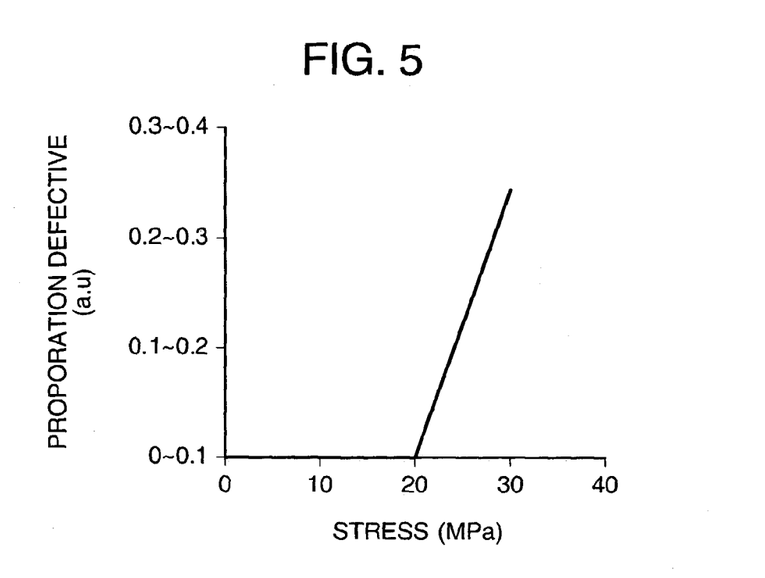
FIG. 5 illustrates a relationship between stress and proportion defective in the semiconductor laser module according to the first preferred embodiment of the invention.

FIG. 5 illustrates the relationship between the stress and the proportion defective in the semiconductor laser module according to the first preferred embodiment of the invention.

The semiconductor laser element 1 shown in FIG. 5, like that in FIG. 3, is made of indium-phosphorus (InP); the semiconductor laser element 1 used here is 200 $\mu$m in length, 400 $\mu$m in width and 100$\mu$ in thickness; the material of the base 4 is copper (Cu), that of the submount 2, aluminum nitride (AlN), that of the solder layer 3, gold-tin (AuSn), and that of the solder layer 5, tin-lead (PbSn). The semiconductor laser element 1 is mounted on the submount and the base, and the proportion defective is assessed. For this assessment, a plurality of samples of the submount 2 all of 4800 $\mu$m in width W and varied in thickness T were produced, the stress in each sample was figured out on the basis of analytical results shown in FIG. 3, and the relationship between the stress so figured out and the proportion defective was determined. The stresses plotted here on the abscissa axis include both tensile stress and compressive stress. However, as is understood from FIG. 3, since no more than about +20 MPa of tensile stress arises, data of the proportion defective on the abscissa axis above 20 MPa all relate to compressive stress. However, since compressive stress and tensile stress manifest similar proportions defective in the region at or below 20 MPa, the proportion defective due to tensile stress in the region above 20 MPa is likely to show a similar tendency.

As seen from FIG. 5, in the stress region of or below 20 MPa, the proportion defective does not vary with an increase in stress. On the other hand, when the stress surpasses 20 MPa, the proportion defective steeply rises. The presumable reason is that, when the stress working in the optically active layer of the semiconductor laser element 1 surpasses 20 MPa, the behavior within the optically active layer abruptly changes.

These findings have revealed that a semiconductor laser element that can meet the requirement for higher output and greater accuracy in wavelength can be obtained by keeping the stress working in the laser element not less than –20 MPa but not more than +20 MPa, which could help reduce defects such as kinks.

To assess the results shown in FIG. 3 on the basis of the findings shown in FIG. 5, the stress can be kept within the range of ±20 MPa by keeping T no smaller than 400 $\mu$m when the submount width W is 2800 $\mu$m, and eventually the proportion defective can be reduced to improve the production yield. When the submount width W is 4800 $\mu$m the stress can be kept within the range of ±20 MPa by keeping T no smaller than 700 $\mu$m, and eventually the proportion defective can be reduced to improve the production yield. To add, since too great a submount thickness T would invite an increase in thermal resistance, the upper limit of the thickness T should preferably be no more than 1500 $\mu$m.

Then to assess the results shown in FIG. 4 on the basis of the findings shown in FIG. 5, to keep the stress working in the laser element not less than –20 MPa but not more than +20 MPa and thereby to obtain a semiconductor laser element that can meet the requirement for higher output and greater accuracy in wavelength, the thickness T and the width W of the submount should satisfy the following condition:

$$T/W \geq 0.15.$$

In this way, the stress can be kept within the range of ±20 MPa; eventually the proportion defective can be reduced, defects such as kinks can be prevented, and the production yield can be improved. As mentioned above, since too great a submount thickness T would invite an increase in thermal resistance, the upper limit of the thickness T should preferably be no more than 1500 μm.

Next will be explained how the stress working in the optically active layer of the semiconductor laser element 1 in the semiconductor laser module embodying the invention in this mode differs with the material of the base with reference to FIG. 6 through FIG. 8.

Figure 6:
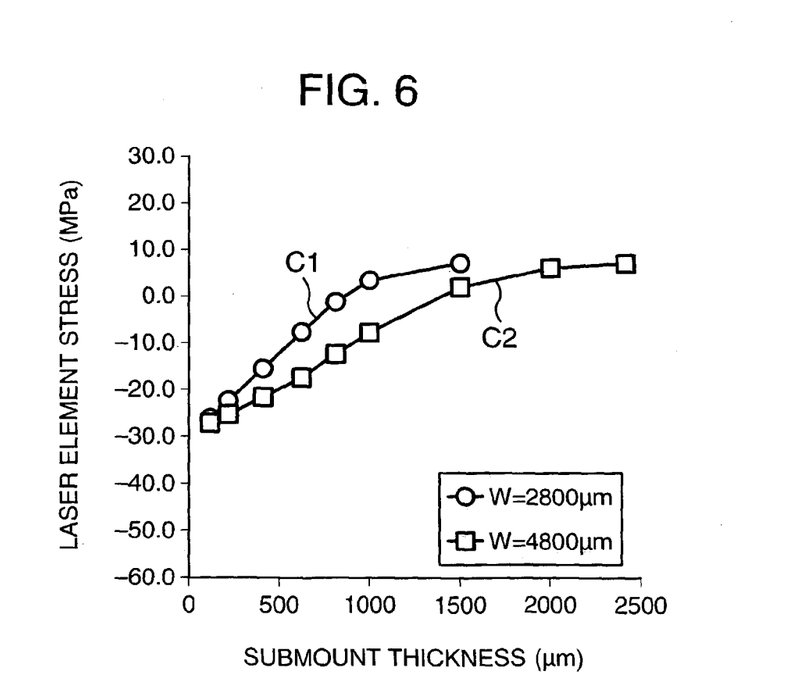
FIG. 6 illustrates how the stress working in the optically active layer of the semiconductor laser element 1 in the semiconductor laser module according to the first preferred embodiment of the invention, differs with the material of the base.
Figure 7:
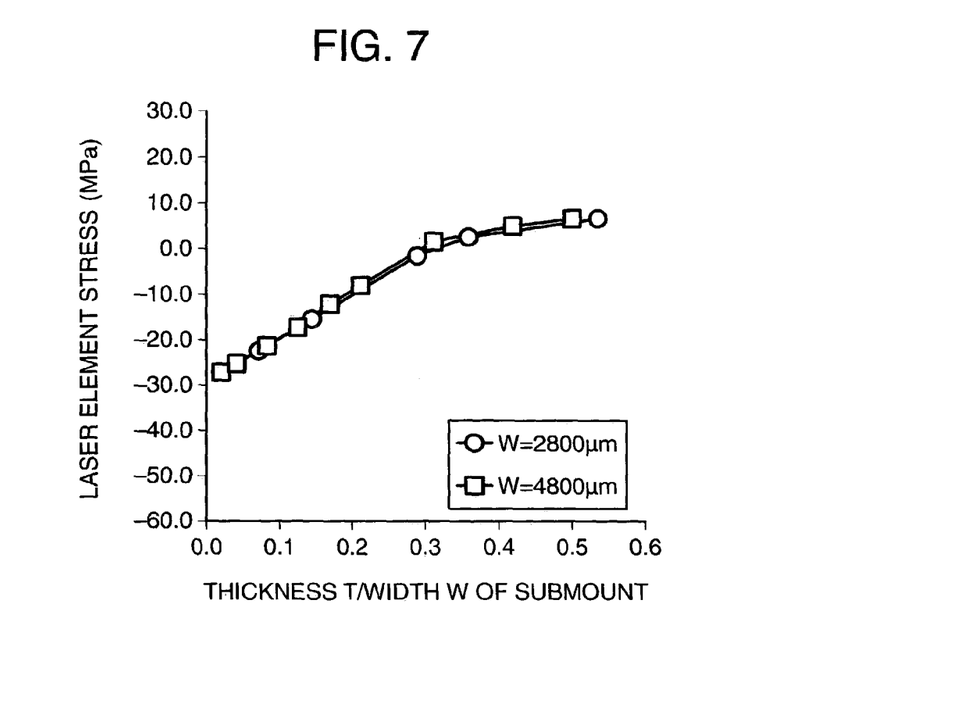
FIG. 7 illustrates in another way how the stress working in the optically active layer of the semiconductor laser element 1 in the semiconductor laser module according to the first preferred embodiment of the invention, differs with the material of the base.
Figure 8:
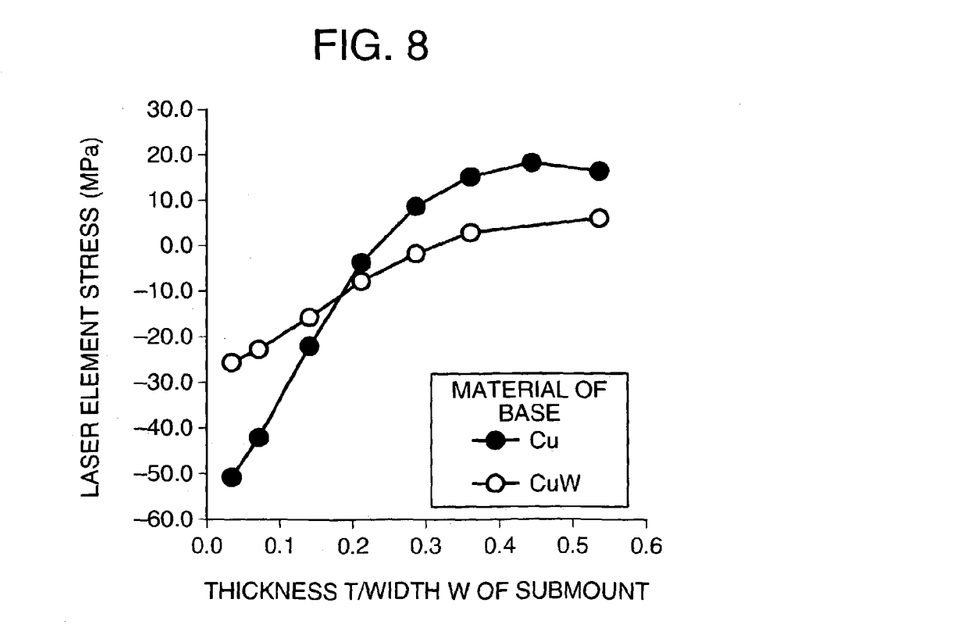
FIG. 8 illustrates in still another way how the stress working in the optically active layer of the semiconductor laser element 1 in the semiconductor laser module according to the first preferred embodiment of the invention, differs with the material of the base.

FIG. 6 through FIG. 8 illustrate how the stress working in the optically active layer of the semiconductor laser element 1 in the semiconductor laser module according to the first preferred embodiment of the invention, varies with the material of the base.

FIG. 6 shows the relationship between the stress working in the optically active layer (not shown) of the semiconductor laser element 1 and the submount thickness T. The axis of ordinate in FIG. 6 represents the laser element stress (in MPa) working in the optically active layer of the semiconductor laser element 1, wherein the negative stress level here means compressive stress, and the positive stress level, tensile stress. The abscissa axis in FIG. 6 represents the thickness T (μm) of the submount 2. That is, FIG. 6 illustrates the dependence of the laser element stress on the submount thickness T.

FIG. 6 shows the relationship between the stress working in the optically active layer (not shown) of the semiconductor laser element 1, wherein the material of the base is CuW, intended for the base for production use, and the submount thickness T. The conditions here differ from those shown in FIG. 3 only in the material of the base. In FIG. 6, as in FIG. 3, the submount width W is 2800 μm and 4800 μm.

It is seen from FIG. 6 that, when the submount width W is 2800 μm (solid line C1), the stress can be reduced substantially to zero by setting the thickness T to 800 μm. Further, when the submount width W is 4800 μm (solid line C2), the stress can be reduced substantially to zero by setting the thickness T to 1400 μm. To keep the stress working in the laser element between −20 MPa and +20 MPa and thereby to prevent defects in the element, such as kinks, T should be no less than 250 μm if the submount width W is 2800 μm or no less than 400 μm if the submount width W is 4800 μm. However, since too great a submount thickness T would invite an increase in thermal resistance, the upper limit of the thickness T should preferably be no more than 1500 μm.

FIG. 7 shows the relationship between the stress working in the optically active layer (not shown) of the semiconductor laser element 1 and the thickness T/width W ratio of the submount. The abscissa axis in FIG. 7 represents the thickness T/width W ratio of the submount. FIG. 7 shows the result of rearrangement of the stress levels shown in FIG. 6 into their relationship to the submount thickness T/width W ratio. This reveals that the relationship between the element stress and T/W is not dependent on the submount width W. That is, it is seen from FIG. 7 that the element stress can be reduced substantially to zero by setting the submount thickness T/width W ratio to 0.3 independent of the submount width.

As seen from FIG. 7, to keep the stress working in the laser element not less than −20 MPa but not more than +20 MPa and thereby to obtain a semiconductor laser element that can meet the requirement for higher output and greater accuracy in wavelength, T/W should be no smaller than 0.1, and this eventually enables the proportion defective to be reduced to improve the production yield. To add, since too great a submount thickness T would invite an increase in thermal resistance, the upper limit of the thickness T should preferably be no more than 1500 μm.

FIG. 8 puts together into a single graph the results shown in FIG. 4 and FIG. 7. That is, FIG. 8 shows the relationships between the stress working in the optically active layer (not shown) of the semiconductor laser element 1 and the thickness T/width W ratio of the submount when Cu is used as the base material and when CuW is used.

Where the material of the base for testing use is different from that of the base for production use as stated above, the former being inexpensive copper which is higher in thermal conductivity and the latter being copper-tungsten which is lower in thermal conductivity but smaller in linear expansion coefficient than copper, prevention of defects including kinks can be achieved by appropriately setting the thickness/width ratio of the submount so as to reduce the stress arising in the element.

As seen from FIG. 8, the stress is less where a copper-tungsten base is used than where a copper base is used. Therefore, FIG. 8 reveals from the data of the base of Cu that, to keep the stress working in the laser element not less than −20 MPa but not more than +20 MPa and thereby to obtain a semiconductor laser element that can meet the requirement for higher output and greater accuracy in wavelength, T/W can be kept no smaller than 0.15. However, as noted with reference to FIG. 3, since too great a submount thickness T would invite an increase in thermal resistance, the upper limit of the thickness T should preferably be no more than 1500 μm.

Further, the present inventors' research has revealed that the wavelength of the laser beam emitted by the semiconductor laser element is dependent on the element stress. That is, it has been found that the wavelength of emission from the same element could vary with the element stress at the time of testing. A difference in element stress between the checkup after the element assembling step and the checkup after the module assembling step means that a product that could be found acceptable in the checkup after the module assembling step may be rejected in the checkup after the element assembling step, and this would invite a drop in production yield. The yield can be prevented from falling off, even where the material of the base for testing use and that of the base for production use differ in every sequence of checkup, by making the element stress independent of the base material. In view of this point, the impact of a difference in base material on wavelength variations was assessed, and it was found that a difference of at least ±15 MPa in laser element stress (difference in element stress) between the use of a first base (of copper for instance) and that of a second base (of copper-tungsten for instance) would meet the requirement. From this point of view, as is seen from FIG. 8, when T/W is not smaller than 0.1, the difference in element stress at the checkup can be kept within the range of ±15 MPa even if the base material is changed.

On the other hand, to keep the element stress within the range of ±20 MPa and thereby to prevent defects including kinks, T/W should be kept not smaller than 0.15 as stated above. Therefore, if T/W is kept not smaller 0.15, there will be no impact of wavelength variations due to a difference in base material.

As described above, this embodiment of the invention can prevent such deficiencies as current threshold fluctuations or kinks from occurring by reducing the element stress at the time of packaging, and thereby enhance the production yields of semiconductor laser elements and semiconductor laser modules.

Next will be described the structure of a semiconductor laser module according to a second preferred embodiment of the invention with reference to FIG. 9 through FIG. 12B.

First will be described the structure of the semiconductor laser module embodying the invention in this mode with reference to FIG. 9.

Figure 9:
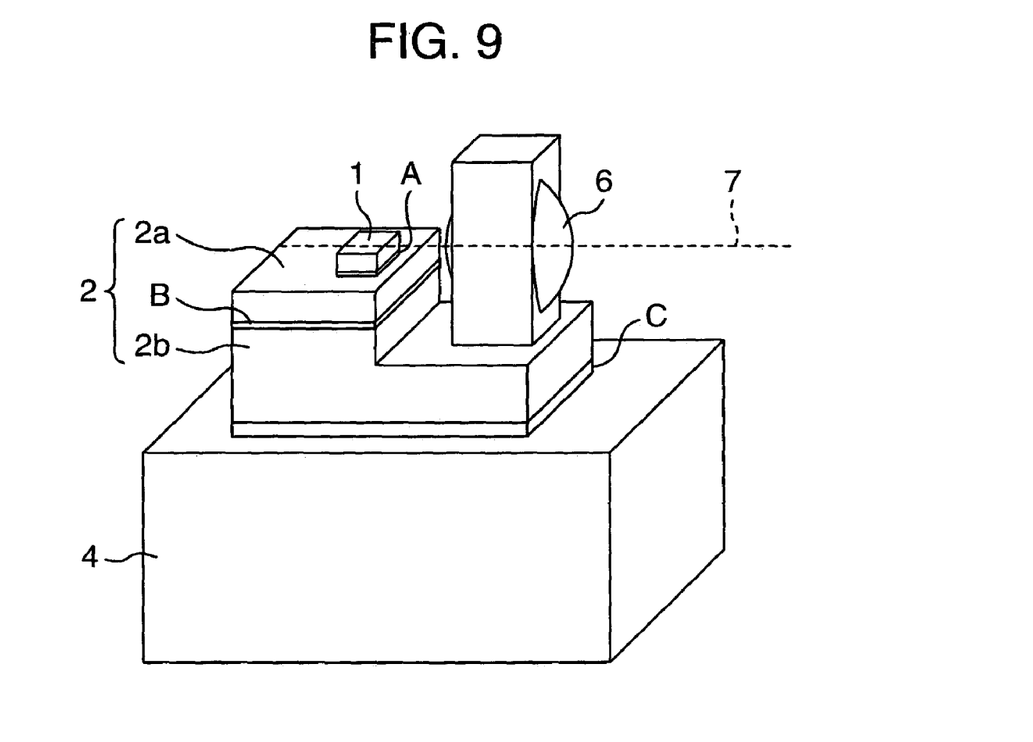
FIG. 9 shows a perspective view of the structure of a semiconductor laser module according to a second preferred embodiment of the invention.

FIG. 9 shows a perspective view of the structure of the semiconductor laser module according to the second preferred embodiment of the invention. The overall structure of the semiconductor laser module embodying the invention in this mode is the same as what is shown in FIG. 1. The same reference signs as in FIG. 2 denote respectively the same constituent parts.

The configuration of the semiconductor laser element 1 is such that, for instance, an optically active layer, an insulating layer, electrodes and so forth are formed over an InP substrate (400 $\mu$m in width×200 $\mu$m in length×100 $\mu$m in thickness). The submount 2 on which the semiconductor laser element 1 is to be mounted has a structure laminated into at least two layers in the thickness direction including a submount upper member 2a towards the semiconductor laser element 1 and a submount lower member 2b towards the base 4. For instance, the submount upper member 2a is made of aluminum nitride (AlN) (4.5×10$^{-6}$/° C. in linear expansion coefficient, 170 W/m ° C. in thermal conductivity and 4 mm×2 mm×0.3 mm in thickness) whose linear expansion coefficient is close to that of InP (4.3×10$^{-6}$/° C. linear expansion coefficient), the main material of the semiconductor laser element. The submount lower member 2b is made of copper-tungsten (Cu20W80) (8.3×10$^{-6}$/° C. in linear expansion coefficient, 200 W/m ° C. in thermal conductivity, and 4 mm in width×2 mm in length×1 mm in thickness) whose thermal conductivity is greater than that of the submount upper member 2a.

The submount upper member 2a and the submount lower member 2b are bonded with a solder layer B. The semiconductor laser element 1 is bonded onto the submount 2 with a solder layer A. Further, the submount lower member 2b is bonded to the base 4 with a solder layer C. The base 4 is made of copper-tungsten (Cu20W80) (8.3×10$^{-6}$/° C. in linear expansion coefficient, 200 W/m ° C. in thermal conductivity, and 2 mm in thickness). The laminated structure of the submount here is a structure having a combination of members each being a layer of at least 0.1 mm in thickness.

The melting points of the solder layers A, B and C here being represented by $\alpha A$, $\alpha B$ and $\alpha C$, respectively, they are in a relationship of $\alpha B > \alpha A > \alpha C$. For instance, the solder layer B is made of gold-germanium (AuGe) (356° C. in melting point), the solder layer A, of gold-tin (AuSn) (280° C. in melting point), and the solder layer C, of tin-lead (PbSn) (183° C. in melting point).

Next will be described a first procedure of mounting the semiconductor laser element on the submount and the base in the semiconductor laser module embodying the invention in this mode with reference to FIG. 10A through FIG. 10C.

Figure 10A:
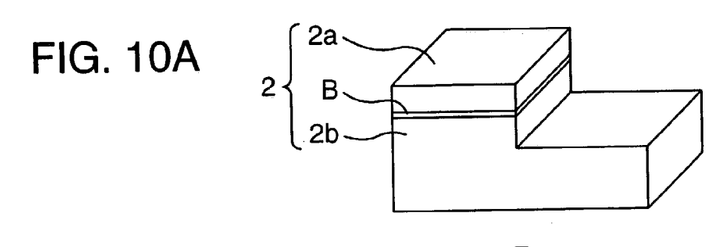
FIG. 10A through FIG. 10C constitute a process diagram showing a first procedure of mounting a semiconductor laser element on a submount and a base in the semiconductor laser module according to the second preferred embodiment of the invention.
Figure 10B:
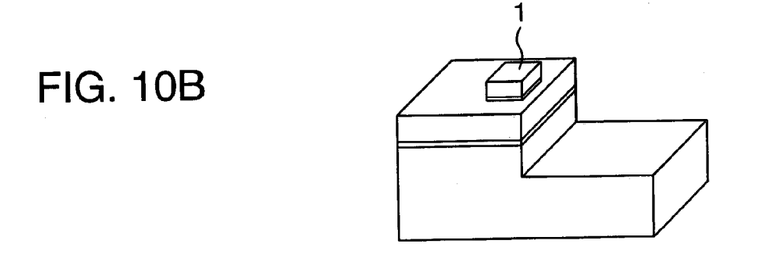
Figure 10C:
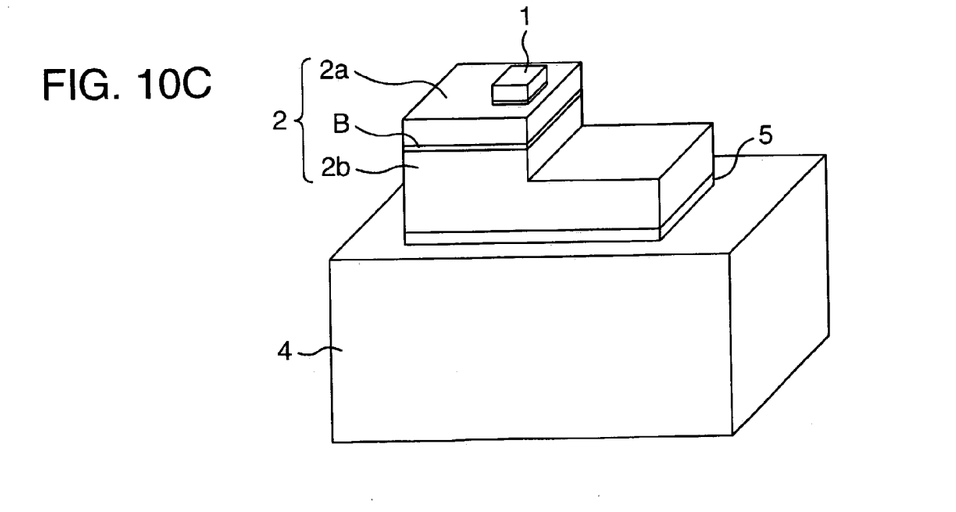

FIG. 10A through FIG. 10C constitute a process diagram showing the first procedure of mounting the semiconductor laser element on the submount and the base in the semiconductor laser module according to the second preferred embodiment of the invention.

As shown in FIG. 10A, the submount upper member (AlN) 2a and the submount lower member (Cu20W80) 2b are bonded together by being heated to or above 356° C., the melting point of the solder layer (AuGe) B, and then cooled to room temperature to constitute the submount 2. As is further shown in FIG. 10B, the semiconductor laser element 1 is bonded onto the submount 2 after being heated to 280° C., the melting point of the solder layer (AuGe) A, and then cooled. Further as shown in FIG. 10C, the submount mounted with the semiconductor laser element 1 is bonded 2 after being heated to 183° C., the melting point of the solder layer (PbSn) C, and cooled.

In the semiconductor laser module embodying the invention in this mode, as the submount 2 is formed in a laminated structure and especially as the linear expansion coefficient of the submount upper member 2a is close to that of the laser element 1 (the difference in linear expansion coefficient is 1×10$^{-6}$ or below), it is difficult for thermal stress to work. Furthermore, since the thermal conductivity of the submount lower member 2b is greater than that of the submount upper member 2a, thermal resistance is weak, resulting in excellent heat radiation for the high heat-emitting laser element. Worthy of particular note is that the melting point levels of the solder layer B connecting the submount upper member 2a and the submount lower member 2b, the solder layer A bonding the semiconductor laser element 1 and the submount upper member 2a, and the solder layer C connecting the submount lower member 2b and the base 4 are in a relation ship of $\alpha B > \alpha A > \alpha C$. That, is, the sequence of bonding the semiconductor laser element 1, the submount upper member 2a, the submount lower member 2b and the base 4 is such that, after first bonding the submount upper member 2a and the submount lower member 2b together, the semiconductor laser element 1 is bonded to them, and the base 4 is further bonded to them. This sequence makes it possible to substantially suppress the thermal stress arising in the semiconductor laser element.

Now will be described a second procedure of mounting the semiconductor laser element on the submount and the base in the semiconductor laser module embodying the invention in this mode with reference to FIG. 11A and FIG. 11B.

Figure 11A:
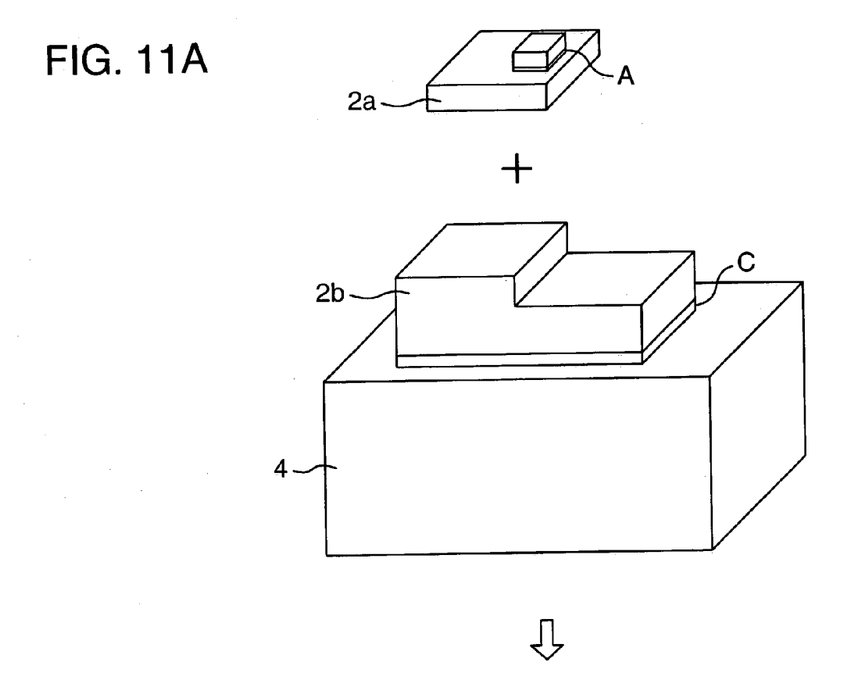
FIG. 11A and FIG. 11B constitute a process diagram showing a second procedure of mounting a semiconductor laser element on a submount and a base in the semiconductor laser module according to the second preferred embodiment of the invention.
Figure 11B:
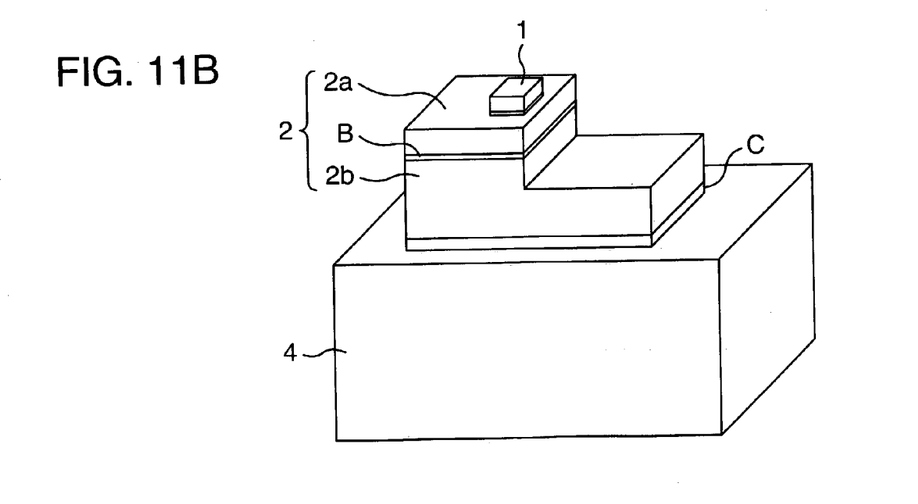

FIG. 11A and FIG. 11B constitute a process diagram showing the second procedure of mounting the semiconductor laser element on the submount and the base in the semiconductor laser module according to the second preferred embodiment of the invention.

The melting points of the solder layers A, B and C here being represented by $\alpha A$, $\alpha B$ and $\alpha C$, respectively, they are in a relationship of $\alpha C > \alpha A > \alpha B$, and as shown in FIG. 10A, the semiconductor laser element 1 is bonded onto the submount upper member 2a with the solder layer A and, apart from that, the submount lower member 2b and the base 4 are bonded together with the solder layer C. After that, as shown in FIG. 10B, the submount upper member 2a and the submount lower member 2b are bonded together with the solder layer B. Here, the solder layer A is made of AuSn, the solder layer B, of PbSn and the solder layer C, of AuGe.

Next will be explained, with reference to FIG. 12A and FIG. 12B, the stress working in the optically active layer of the semiconductor laser element 1 in the semiconductor laser module.

Figure 12A:
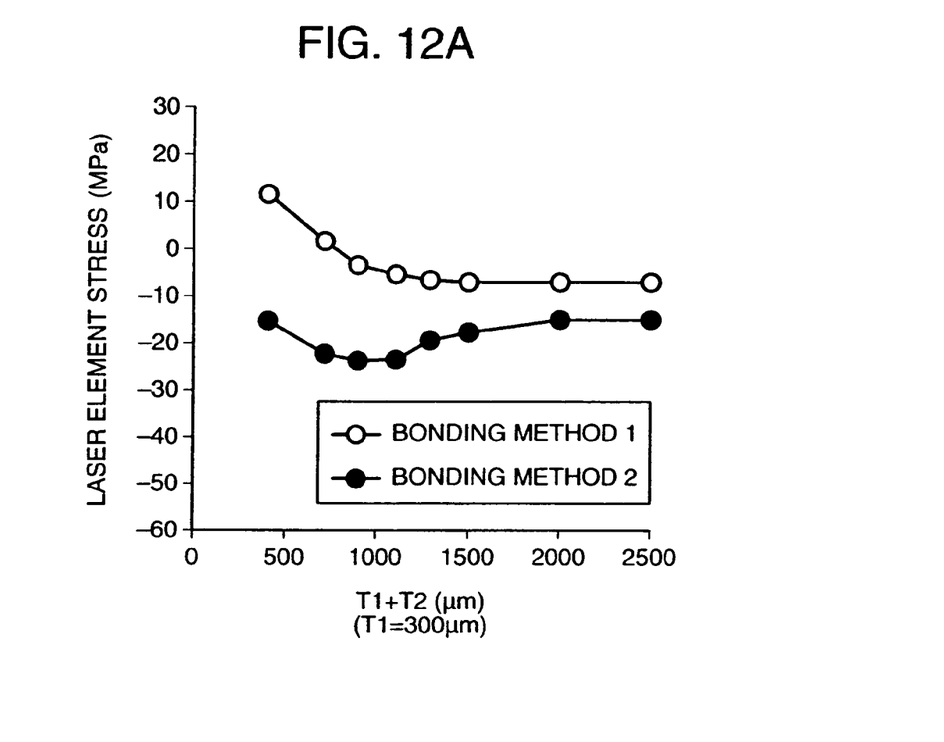
FIG. 12A and FIG. 12B illustrate how stress works in the optically active layer of the semiconductor laser element 1 in the semiconductor laser module according to the second preferred embodiment of the invention.
Figure 12B:
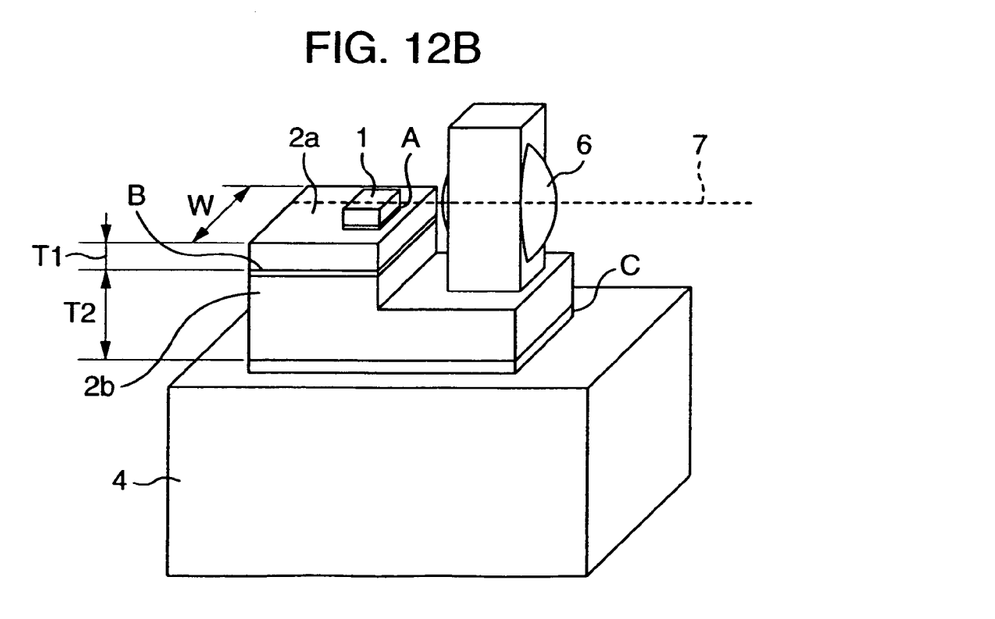

FIG. 12A and FIG. 12B illustrate how the stress works on the optically active layer of the semiconductor laser element 1 in the semiconductor laser module according to the second preferred embodiment of the invention.

FIG. 12A shows the relationship between the stress working in the optically active layer (not shown) of the semiconductor laser element 1 and the submount thickness. The axis of ordinate in FIG. 12A represents the laser element stress (in MPa) working in the optically active layer of the semiconductor laser element 1, wherein the negative stress level here means a compressive stress, and the positive stress level, a tensile stress. The abscissa axis in FIG. 12A represents the thickness T (in $\mu$m) of the submount 2. The submount thickness T, as shown in FIG. 12B, is the sum of thickness T1 of the submount upper member 2a and the thickness T2 of the submount lower member 2b.

Bonding method 1 here means bonding of the semiconductor laser element, the submount and the base in the sequence shown in FIG. 10A through FIG. 10C. Bonding method 2 means bonding of the semiconductor laser element, the submount and the base in the sequence shown in FIG. 11A and FIG. 11B.

FIG. 12A shows calculated results analytically obtained by the finite element method (FEM). The semiconductor laser element 1 here is mainly made of InP, and measures 100 $\mu$m in thickness and 400 $\mu$m in width. The submount upper member 2a is made of AlN, and measures 300 $\mu$m in thickness T1 and 1400 $\mu$m in width W. The submount lower member 2b is made of Cu20W80, and its thickness is represented by T2. The base 4 is made of Cu20W80, and its thickness is 3000 $\mu$m. FIG. 12A shows the dependence of the stress working in the active layer of the laser element on the combined thickness T1+T2 of the submount upper member 2a and of the submount lower member 2b, i.e. on the submount thickness.

As shown in FIG. 12A, by bonding method 1 the stress working in the semiconductor laser element can be reduced more than by bonding method 2. Especially by setting the submount thickness (T1+T2) to 750 $\mu$m, it is possible to almost completely prevent the stress from working in the semiconductor laser element. Similarly, even when the width W of the submount upper member differs, the thicknesses T1 and T2 of the submount upper member and of the submount lower member can be so determined as to effectively reduce the stress by laminating the submount and setting the relationship of the melting points of the solder layer materials according to bonding method 1.

As described above, the semiconductor laser module embodying the invention in this mode can suppress the occurrence of stress working in the semiconductor laser element and prevent the element from deterioration by adopting a laminated structure for the submount to mount the semiconductor laser element in which a member whose linear expansion coefficient is close to that of the semiconductor laser element and a member having a high degree of thermal conductivity are stacked one over the other, and appropriately determining its dimensions and configuration. It is thereby made possible to reduce the thermal stress arising in the element when packaged, prevent defects including current threshold fluctuations and kinks, and to obtain semiconductor laser elements and semiconductor laser modules available in a high yield of element production.

As hitherto described, the present invention enables the stress to be sufficiently reduced and the production yield to be improved.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor laser module having a semiconductor laser element, a submount bonded to this semiconductor laser element with a solder layer in-between and thereby mounted with it, and a base mounted with this submount with another solder layer in-between, wherein:

T/W$\geq$0.15 holds, where W is a width of said submount in a direction orthogonal to an optical axis of said semiconductor laser element and T is a thickness of said submount, and the main constituent material of said semiconductor laser element is indium-phosphorus, the member constituting said submount is aluminum nitride, and the main constituent material of said base is copper-tungsten.

* * * * *